(12) United States Patent
Nishikawa et al.

(10) Patent No.: US 8,755,679 B2
(45) Date of Patent: Jun. 17, 2014

(54) LIQUID MATERIAL VAPORIZER

(71) Applicant: HORIBA STEC, Co., Ltd., Kyoto (JP)

(72) Inventors: Ichiro Nishikawa, Kyoto (JP); Takeshi Kawano, Uji (JP)

(73) Assignee: Horiba STEC, Co., Ltd., Kyoto-shi (JP)

( * ) Notice: Subject to any disclaimer, the term of this patent is extended or adjusted under 35 U.S.C. 154(b) by 0 days.

(21) Appl. No.: 13/633,045

(22) Filed: Oct. 1, 2012

(65) Prior Publication Data

US 2013/0037974 A1 Feb. 14, 2013

Related U.S. Application Data

(63) Continuation-in-part of application No. 12/295,862, filed as application No. PCT/JP2007/057593 on Apr. 4, 2007, now Pat. No. 8,280,235.

(30) Foreign Application Priority Data

Apr. 5, 2006 (JP) .................................. 2006-103803

(51) Int. Cl.
*F24H 1/18* (2006.01)
(52) U.S. Cl.
USPC ............ 392/401; 392/387; 392/386; 392/399
(58) Field of Classification Search
None
See application file for complete search history.

(56) References Cited

U.S. PATENT DOCUMENTS

| | | | | |
|---|---|---|---|---|
| 1,421,937 A | * | 7/1922 | Goldberg | 219/628 |
| 2,775,683 A | * | 12/1956 | Kleist | 392/398 |
| 5,265,318 A | * | 11/1993 | Shero | 29/447 |
| 5,470,225 A | * | 11/1995 | Fujiwara et al. | 431/215 |
| 5,520,001 A | | 5/1996 | Miyamoto et al. | |
| 5,630,878 A | | 5/1997 | Miyamoto et al. | |
| 6,082,714 A | | 7/2000 | Dornfest et al. | |
| 6,258,170 B1 | | 7/2001 | Somekh et al. | |
| 6,424,800 B1 | | 7/2002 | Kim | |
| 6,470,144 B1 | | 10/2002 | Tarutani et al. | |

(Continued)

FOREIGN PATENT DOCUMENTS

| | | |
|---|---|---|
| JP | 10140356 | 5/1998 |
| JP | 11006066 A | 1/1999 |

(Continued)

OTHER PUBLICATIONS

ISA Japan, International Search Report of PCT/JP2007/057593, Jun. 12, 2007, WIPO, 1 page.

(Continued)

*Primary Examiner* — Thor Campbell
(74) *Attorney, Agent, or Firm* — Alleman Hall McCoy Russell & Tuttle LLP

(57) ABSTRACT

A liquid material vaporizer comprises a gas-liquid mixing section for mixing a liquid material and a carrier gas to generate a gas-liquid mixture, and a heating type vaporizing section for vaporizing the gas-liquid mixture from the gas-liquid mixing section and exhausting outside the gas generated by the vaporization with assistance of the carrier gas, wherein the vaporizing section is configured with an arrangement of one or a plurality of flat plates formed in a spiral shape by an inwardly twisting path. Such an arrangement provides an excellent liquid material vaporizer capable of, even if a liquid material composed of a plurality of materials having different boiling points is vaporized, preventing a residue from being generated, and performing the vaporization in a preferable manner.

4 Claims, 13 Drawing Sheets

(56) References Cited

U.S. PATENT DOCUMENTS

| | | | |
|---|---|---|---|
| 6,494,957 B1 | 12/2002 | Suzuki | |
| 7,055,808 B2 | 6/2006 | Sivaramakrishnan et al. | |
| 7,756,404 B2* | 7/2010 | Schubert et al. | 392/478 |
| 8,028,664 B2* | 10/2011 | Kim | 122/481 |
| 8,180,207 B2* | 5/2012 | Shirai et al. | 392/491 |
| 2002/0192375 A1* | 12/2002 | Sun et al. | 427/255.28 |
| 2003/0226505 A1 | 12/2003 | Sivaramakrishnan et al. | |
| 2012/0186791 A1* | 7/2012 | Ciora et al. | 165/109.1 |
| 2013/0202279 A1* | 8/2013 | Reichl et al. | 392/480 |

FOREIGN PATENT DOCUMENTS

| | | |
|---|---|---|
| JP | 2001131754 | 5/2001 |
| JP | 2003163168 | 6/2003 |
| JP | 2003273025 | 9/2003 |
| JP | 2004002906 A | 1/2004 |
| JP | 2004031441 A | 1/2004 |
| JP | 2004119486 A | 4/2004 |
| JP | 2005026599 A | 1/2005 |
| JP | 2005057193 A | 3/2005 |
| JP | 2005327864 A | 11/2005 |
| JP | 2005533178 A | 11/2005 |
| JP | 5090341 B2 | 12/2012 |
| WO | 2004007796 A1 | 1/2004 |

OTHER PUBLICATIONS

ISA European Patent Office, Search Report of EP07741029, Feb. 19, 2010, Netherlands, 1 page.

Japanese Patent Office, Decision to Grant a Patent from Japanese Patent Application No. 2012-054917, Jan. 30, 2014, 4 pages.

* cited by examiner

LIQUID MATERIAL VAPORIZER

CROSS REFERENCE TO RELATED APPLICATION

This application is a continuation in part of U.S. patent application Ser. No. 12/295,862, titled LIQUID MATERIAL VAPORIZER, filed Nov. 13, 2008, which is a national stage of PCT/JP2007/057593, filed Apr. 4, 2007, which in turn claims priority to Japanese Patent Application No. 2006-103803, filed Apr. 5, 2006, the entire contents of each of which are hereby incorporated by reference for all purposes.

FIELD OF THE INVENTION

The present invention relates to a liquid material vaporizer for vaporizing various liquid materials used in semiconductor manufacturing.

BACKGROUND ART

There is conventionally known a liquid material vaporizer adapted to be able to surely vaporize a liquid material without thermal decomposition even if the liquid material is likely to be thermally decomposed.

Specifically, this sort of liquid material vaporizer includes: a gas-liquid mixing section including a control valve that is supplied with a liquid material and a carrier gas, and provided with a flow rate control function for mixing the liquid material with the carrier gas while controlling a flow rate of the liquid material; a vaporizing section that is provided separately from the gas-liquid mixing section, and intended for discharging and depressurizing a gas-liquid mixture introduced from the gas-liquid mixing section through a pipeline to thereby vaporize the liquid material and exhausting with the assistance of the carrier gas a gas generated by the vaporization; the pipeline for making a connection between the gas-liquid mixing section and the vaporizing section; and the like (see, for example, Patent document 1).

Patent document 1: Japanese Unexamined Patent Publication No. 2003-163168

DISCLOSURE OF THE INVENTION

Problems to be Solved by the Invention

However, a conventional configuration has a problem that if the liquid material formed by dissolving a high boiling point solute in a low boiling point material solvent is vaporized, only the low boiling point material solvent is vaporized in the pipeline, and the high boiling point solute becomes a residue, which blocks the pipeline, and other problems.

The present invention is made by focusing on such problems, and a main object thereof is to provide an excellent liquid material vaporizer that, even if the liquid material formed by dissolving the high boiling point solute in the low boiling point material solvent is vaporized, does not have the problem that only the low boiling point material solvent is vaporized in the pipeline, and the high boiling point solute becomes a residue, which blocks the pipeline.

Means Adapted to Solve the Problems

That is, a liquid material vaporizer according to the present invention is configured to include: a gas-liquid mixing section for mixing a liquid material and a carrier gas to generate a gas-liquid mixture; a heating type vaporizing section for vaporizing the gas-liquid mixture from the gas-liquid mixing section and exhausting outside with an assistance of the carrier gas a gas generated by the vaporization; a connecting section for making a connection between the gas-liquid mixing section and the vaporizing section, the connecting section having a flow path for the gas-liquid mixture inside thereof; and a connecting section cooling section for cooling the connecting section.

Note that the "liquid material" by which an effect of the liquid material vaporizer of the present invention can be particularly verified includes a liquid-like material in which a plurality of materials having different boiling points are mixed, for example, a liquid material formed by dissolving a high boiling point solute in a low boiling point material solvent. In addition, it should be appreciated that the liquid material vaporizer can vaporize the other liquid materials (for example, one including a single constituent, one in which a plurality of materials having a same boiling point are mixed, and the like). Also, a method for producing the liquid material may be any one, for example, one including dissolving a solid in a liquid to form the liquid material, one including mixing liquids with each other, or other method.

Such configuration enables heat of the vaporizing section to be suppressed from transferring toward the gas-liquid mixing section, and the gas-liquid mixture passing through a flow path inside the connecting section to be suppressed from being affected by energy of the heat, by the connecting section cooling section cooling the connecting section. Accordingly, even if the liquid material formed by, for example, dissolving a high boiling point solute in a low boiling point material solvent is vaporized, there can be prevented a problem that only the low boiling point material solvent is vaporized, and the high boiling point solute becomes a residue in a pipeline, or diaphragm for liquid flow rate control inside the gas-liquid mixing section, which blocks an internal flow path of the connecting section or the diaphragm.

That is, there can be provided an excellent liquid material vaporizer capable of, even if the liquid material including a plurality of materials having different boiling points is vaporized, preventing a residue from being generated, and preferably performing the vaporization.

To obtain a higher effect of preventing the residue generation, the connecting section cooling section preferably cools the connecting section substantially entirely.

Even if the vaporizing section is heated to and retained at approximately 300 degrees C., the gas-liquid mixing section can be cooled to approximately 60 degrees C. by an action of the connecting section cooling section, and therefore the residue can be preferably prevented from being generated while ensuring a function of a high temperature type vaporizing section.

A specific aspect of the connecting section cooling section of the present invention includes one in which the connecting section cooling section is configured to include one or a plurality of connecting section cooling fins that are supplied with a cooling gas and fitted to the connecting section. By employing such a configuration, a high cooling effect can be obtained, and the problem of the residue generation can be preferably prevented even though the configuration is simple.

With this, if the connecting section cooling fins are arranged in a cooling case having: an inlet for introducing the cooling gas inside thereof; and an outlet for exhausting the cooling gas having been used for cooling outside thereof, the cooling gas can be effectively supplied to the connecting section cooling fins, so that in addition to effectively cooling the connecting section cooling fins, required cold air from the cooling gas can be prevented from escaping and wasting, which is useful for energy saving.

Providing a cooling gas cooling section for preliminarily cooling the cooling gas enables a higher cooling effect in the connecting section to be obtained, and is effective in preventing the above-described problem.

Note that a desirable aspect of the cooling gas cooling section includes one in which the cooling gas cooling section includes: one or a plurality of cooling gas cooling fins; and a cooling gas cooling Peltier element configured to be fitted toward a flow path for the cooling gas on a cooling side thereof and fitted to the cooling gas cooling fins on a heat generating side thereof.

Another specific aspect of the connecting section cooling section of the present invention includes one in which the connecting section cooling section is configured to include: a connecting section cooling Peltier element fitted to the connecting section on a cooling side thereof; and one or a plurality of Peltier element cooling fins fitted to a heat generating side of the connecting section cooling Peltier element.

Effect of the Invention

As described, the liquid material vaporizer according to the present invention enables the heat of the vaporizing section to be suppressed from transferring toward the gas-liquid mixing section, and the gas-liquid mixture passing through a flow path inside the connecting section to be suppressed from being affected by energy of the heat, by the connecting section cooling section cooling the connecting section. Accordingly, even if the liquid material formed by, for example, dissolving a high boiling point solute in a low boiling point material solvent is vaporized, there can be prevented a problem that only the low boiling point material solvent is vaporized, and the high boiling point solute becomes a residue in a pipeline, or diaphragm for liquid flow rate control inside the gas-liquid mixing section, which blocks an internal flow path of the connecting section, or the diaphragm.

That is, there can be provided an excellent liquid material vaporizer capable of, even if the liquid material including a plurality of materials having different boiling points is vaporized, preventing the residue from being generated, and preferably performing the vaporization.

BEST MODE FOR CARRYING OUT THE INVENTION

Figure 1:
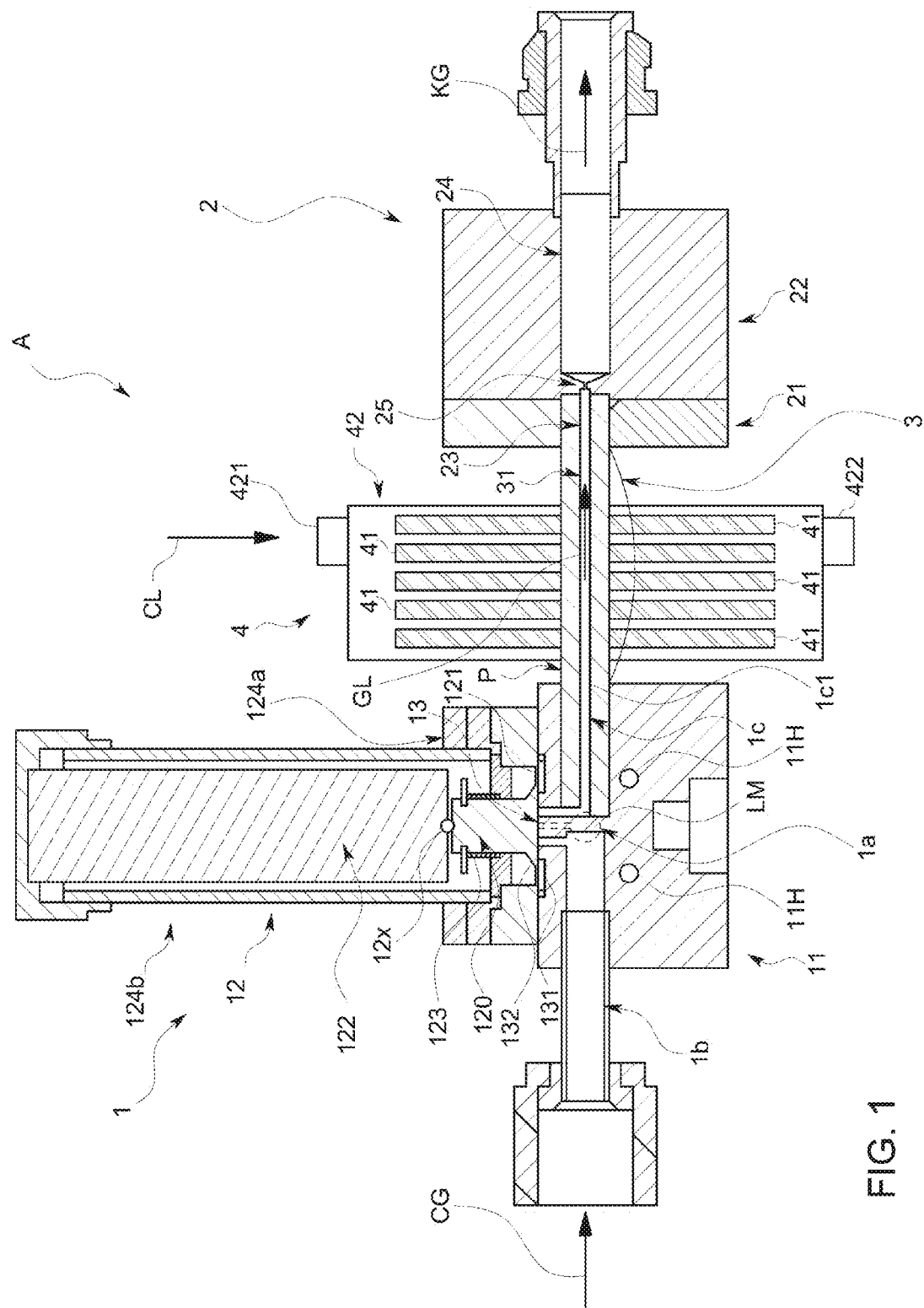
FIG. 1 is a structural cross-sectional view schematically illustrating a structural cross-section of a liquid material vaporizer according to one embodiment of the present invention.

One embodiment of the present invention is described below referring to the drawings.

Figure 2:
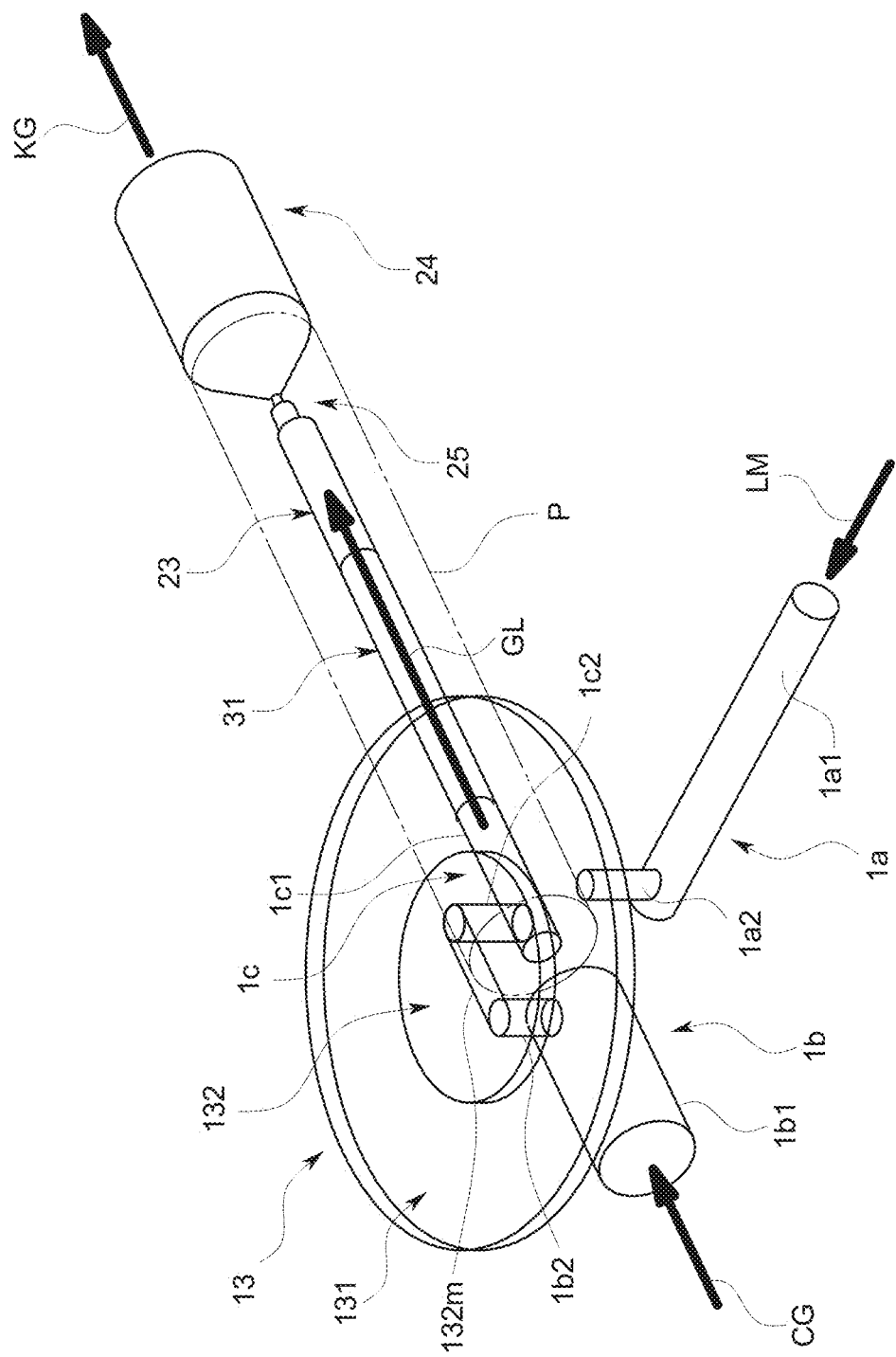
FIG. 2 is a perspective view of a main part in a same embodiment.

A liquid material vaporizer A of the present embodiment is, as illustrated in FIGS. 1 and 2, configured to include: a gas-liquid mixing section 1 for mixing a liquid material LM and a carrier gas CG to generate a gas-liquid mixture GL; a heating type vaporizing section 2 for vaporizing the gas-liquid mixture GL from the gas-liquid mixing section 1 and exhausting the vaporized gas outside with an assistance of the carrier gas CG; a connecting section 3 that is intended for making a connection between the gas-liquid mixing section 1 and the vaporizing section 2 and has inside a flow path for the gas-liquid mixture GL or the like; and a connecting section cooling section 4 for cooling the connecting section 3. The respective sections are specifically described below.

The gas-liquid mixing section 1 is configured to include: a substantially rectangular-shaped main body block 11 having three different flow paths 1a to 1c inside; a flow rate controlling section 12 provided on an upper surface side of the main body block 11; a gas-liquid mixing chamber 13 formed in a space sandwiched between the main body block 11 and the flow rate controlling section 12.

The main body block 11 is formed of a metal material having high thermal and corrosion resistance, such as stainless steel, and configured to be heatable with a heater 11H provided on a lower end side of the three flow paths 1a to 1c.

The three flow paths 1a to 1c respectively refer to: a liquid material introduction path 1a for introducing the liquid material LM into the gas-liquid mixing chamber 13; a carrier gas introduction path 1b for introducing the carrier gas CG into the gas-liquid mixing chamber 13; and a gas-liquid mixture exhaust path 1c for exhausting the gas-liquid mixture GL generated in the gas-liquid mixing chamber 13.

The liquid material introduction path 1a is, as illustrated in FIG. 2 and other drawings, one having a substantially L shape, as viewed from side, including: a liquid material introduction path horizontal section 1a1 extending in a horizontal direction; and a liquid material introduction path rising section 1a2 in which a gas-liquid mixing chamber 13 side of the liquid material introduction path horizontal section 1a1 is risen in a substantially vertical direction. In the present embodiment, a diameter of the liquid material introduction path horizontal section $1a1$ is made substantially equal to that of the liquid material introduction path rising section $1a2$.

The carrier gas introduction path $1b$ is, as illustrated in FIG. 2 and other drawings, one having a substantially L shape, as viewed from side, including: a carrier gas introduction path horizontal section $1b1$ extending in a horizontal direction; and a carrier gas introduction path rising section $1b2$ in which a gas-liquid mixing chamber 13 side of the carrier gas introduction path horizontal section $1b1$ is risen in a substantially vertical direction. In the present embodiment, a diameter of the carrier gas introduction path horizontal section $1b1$ is made larger than that of the carrier gas introduction path rising section $1b2$.

The gas-liquid mixture exhaust path $1c$ is, as illustrated in FIG. 2 and other drawings, one having a substantially L shape, as viewed from side, including: a gas-liquid mixture exhaust path horizontal section $1c1$ extending in a horizontal direction; and a gas-liquid mixture exhaust path rising section $1c2$ in which a gas-liquid mixing chamber 13 side of the gas-liquid mixture exhaust path horizontal section $1c1$ is risen in a substantially vertical direction. In the present embodiment, a diameter of the gas-liquid mixture exhaust path horizontal section $1c1$ is made equal to that of the gas-liquid mixture exhaust path rising section $1c2$.

Figure 3:
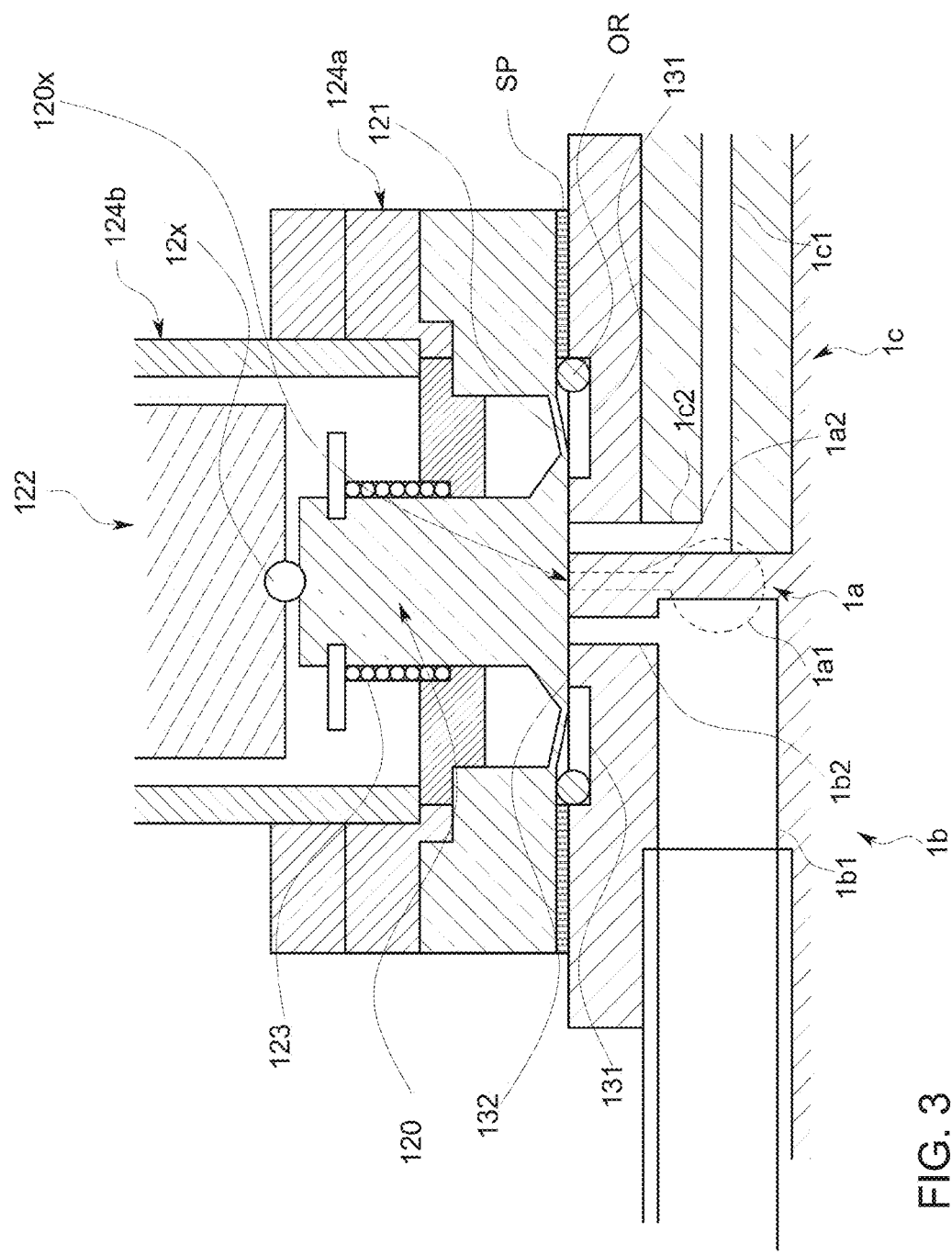
FIG. 3 is a structural cross-sectional view of a gas-liquid mixing chamber portion in the same embodiment (with a volume of the gas-liquid mixing chamber being reduced).
Figure 4:
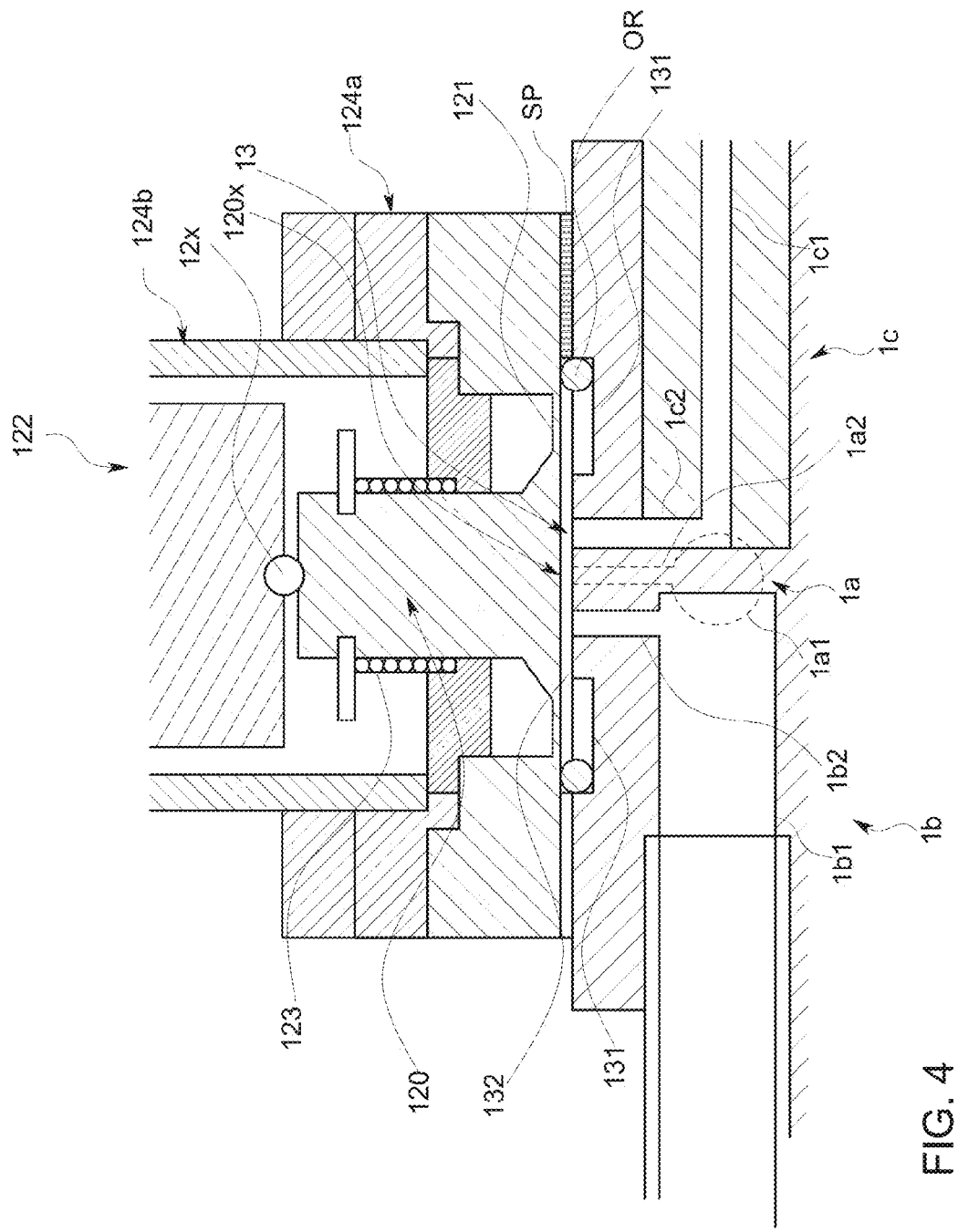
FIG. 4 is a structural cross-sectional view of the gas-liquid mixing chamber portion in the same embodiment (with the volume of the gas-liquid mixing chamber being normal).

The flow rate controlling section 12 is, as illustrated in FIGS. 3 and 4 and other drawings, configured to include: a thin disk-like diaphragm 121 arranged in a position where a concave portion 131 of the main body block 11 can be covered; a substantially cylindrical shaft section 120 provided in the center of the diaphragm 121; a piezo actuator 122 brought into abutting contact with an upper end part of the shaft section 120 via a sphere $12x$; and a biasing member 123 for constantly biasing the shaft section 120 upward, and these respective components are contained inside a valve block $124a$ and also inside a substantially tubular housing $124b$ provided upright on an upper part of the valve block $124a$. Note that, in the present embodiment, the valve block $124a$ is fitted onto the main body block 11 via a spacer SP and an O-ring OR.

Also, in the present embodiment, when the diaphragm 121 is subjected to a pressing force (pressing force larger than a biasing force by the biasing member 123) downward by the piezo actuator 122 via the shaft section 120, it is displaced convexly downward to decrease a volume inside the gas-liquid mixing chamber 13 formed between the diaphragm 121 and a valve seat 132, and block an opening of the liquid material introduction path rising section $1a2$ by a lower end surface $120x$ of the shaft section 120 (see FIG. 3), whereas when it is not subjected to the pressing force, the diaphragm 121 and the lower end surface $120x$ of the shaft section 120 are kept at a level spaced from the valve seat 132 (by an amount equal to a thickness of the spacer SP), and the volume inside the gas-liquid mixing chamber 13 can be appropriately ensured (see FIG. 4).

The gas-liquid mixing chamber 13 is one formed in a space sandwiched between the concave portion 131 in which an upper surface of the main body block 11 is concaved in a substantially dish-like shape and the valve seat 132 of a circular shape as viewed planarly that is arranged in the center of the concave portion 131 and provided at a level higher than a bottom level of the concave portion 131, and an after-mentioned lower end surface of the diaphragm 121 of the flow rate controlling section 12 (see FIG. 4).

In addition, on the concave portion 131, the liquid material introduction path rising section $1a2$ is opened.

Also, the valve seat 132 is provided with a mixing groove $132m$ of a substantially oval shape as viewed planarly. Further, in the mixing groove $132m$, the carrier gas introduction path rising section $1b2$ is opened, and the gas-liquid mixture exhaust path rising section $1c2$ is opened.

The vaporizing section 2 is configured to include: a preheating block 21; a vaporizing block 22 provided on a side of the preheating block 21 opposite to the gas-liquid mixing section 1; a gas introduction path 23 that is provided in substantially the center of the preheating block 21 and passes through in a thickness direction of the preheating block 22; a gas exhaust path 24 that is provided in substantially the center of the vaporizing block 22 and passes through in a thickness direction of the vaporizing block 22; and a nozzle section 25 provided at a connecting section between the gas introduction path 23 and the gas exhaust path 24.

The preheating block 21 is one formed of a metal material having high thermal conductivity, such as aluminum.

The vaporizing block 22 is one formed of a metal material having high thermal and corrosion resistance, such as stainless steel. Also, the vaporizing block 22 incorporates a heater (not shown). By the heater, a whole of the vaporizing block 22 including the nozzle section 25 is adapted to be heated to and retained at a temperature (e.g., approximately 300 degrees C.) considerably higher than a heating and retaining temperature of the main body block 11.

The gas introduction path 23 is one formed by using an after-mentioned internal flow path of a pipe member P.

The gas exhaust path 24 is a substantially straight pipe, whose end on the nozzle section 25 side is formed in a conic shape. In the present embodiment, an outer diameter of the gas exhaust path 24 is set larger than that of the gas introduction path 23. Also, a downstream side of the gas exhaust path 24 is connected to a pipeline (not shown) to semiconductor manufacturing equipment.

The nozzle section 25 is considerably small as compared with diameters and lengths of the gas introduction path 23 and the gas exhaust path 24, and has a diameter and length of, for example, 1.0 mm or less and approximately 1.0 mm, respectively. Through the nozzle section 25, the gas-liquid mixture GL introduced through the gas introduction path 23 flows, and upon the flow, the liquid material LM contained in the gas-liquid mixture GL is depressurized and thereby vaporized, and a gas generated by the vaporization is mixed with the carrier gas CG to become a gas mixture KG.

The connecting section 3 is one having an internal flow path 31 for introducing inside the gas-liquid mixture GL and carrier gas CG from the gas-liquid mixture exhaust path $1c$ and exhausting them toward the gas exhaust path 23 of the vaporizing section 2. In the present embodiment, the internal flow path 31 of the connecting section 3, the gas-liquid mixture exhaust path horizontal section $1c1$ of the gas-liquid mixing section 1, and the gas introduction path 23 of the vaporizing section 2 are adapted to be formed by using the internal flow path of the common pipe member P.

The connecting section cooling section 4 is one of a "forced air cooling type" provided with a plurality of connecting section cooling fins 41 that are externally supplied with a cooling gas CL and fitted to the connecting section 3. Also, the connecting section cooling fins 41 respectively use the same thin plate like fins. Also, the connecting section cooling fins 41 are arrayed at given intervals so as not to prevent the flow of the cooling gas CL. Further, the plurality of connecting section cooling fins 41 are arranged in a cooling case 42 having an inlet 421 for introducing inside the cooling gas CL and an outlet 422 for exhausting outside the cooling gas having been used for cooling.

Next, the usage of the liquid material vaporizer A having the above configuration is described.

First, the liquid material LM through the liquid material introduction path $1a$ is introduced into the mixing groove 132 with a flow rate thereof into the mixing groove $132m$ being controlled by the lower end surface $120x$ of the shaft section 120 driven by the piezo actuator 122, and also the carrier gas CG is introduced into the mixing groove $132m$ through the carrier gas introduction path $1b$. The liquid material LM and carrier gas CG are mixed with each other in the mixing groove $132m$, and then exhausted into the gas-liquid mixture exhaust path $1c$ as the gas-liquid mixture GL. The gas-liquid mixture GL further reaches the vaporizing section 2 through the internal flow path 31 of the connecting section 3.

Note that the connecting section 3 is cooled by the connecting section cooling section 4. This enables heat of the vaporizing section 2 to be suppressed from transferring toward the gas-liquid mixing section 1, and the gas-liquid mixture GL passing through the internal flow path 31 and the like of the connecting section 3 to be suppressed from being affected by energy of the heat. Specifically, if a temperature due to the heat of the vaporizing section 2 is approximately 300 degrees C. and the connecting section cooling section 4 is absent, a temperature of the gas-liquid mixing section 1 is approximately 100 degrees C., whereas if the connecting section cooling section 4 is present, the temperature of the gas-liquid mixing section 1 can be reduced to approximately 60 degrees C. Accordingly, even if the liquid material LM formed by, for example dissolving a high boiling point solute in a low boiling point material solvent is vaporized, there does not arise a problem that only the low boiling point material solvent is vaporized, and the high boiling point solute becomes a residue in the gas-liquid mixture exhaust path horizontal section $1c1$ of the gas-liquid mixing section 1, the internal flow path 31 of the connecting section 3, the gas introduction path 23 of the vaporizing section 2, or the diaphragm 121 for liquid flow rate control inside the gas-liquid mixing section 1, which blocks the internal flow path of the connecting section 3 or the diaphragm 121.

When the gas-liquid mixture GL having been introduced into the gas introduction path 23 of the vaporizing section 2 in a manner described above is further introduced into the nozzle section 25, the liquid material LM contained in the gas-liquid mixture GL is depressurized and thereby vaporized in the nozzle section 25. Then, the gas generated by the vaporization is mixed with the carrier gas CG to become the gas mixture KG, which is then exhausted outside.

Therefore, according to the liquid material vaporizer A as described above, the connecting section cooling section 4 cools the connecting section 3, whereby the heat of the vaporizing section 2 can be suppressed from transferring toward the gas-liquid mixing section 1, and the gas-liquid mixture GL passing through the flow path inside the connecting section 3 can be suppressed from being affected by the energy of the heat. Accordingly, even if the liquid material LM formed by, for example, dissolving a high boiling point solute in a low boiling point material solvent is vaporized, there can be prevented a problem that only the low boiling point material solvent is vaporized, and the high boiling point solute becomes a residue in the gas-liquid mixture exhaust path horizontal section $1c1$ of the gas-liquid mixing section 1, the internal flow path 31 of the connecting section 3, the gas introduction path 23 of the vaporizing section 2, or the diaphragm 121 for liquid flow rate control inside the gas-liquid mixing section 1, which blocks each of the flow paths or the diaphragm 121.

That is, there can be provided the excellent liquid material vaporizer A capable of, even if the liquid material LM including a plurality of materials having different boiling points is vaporized, preventing the residue from being generated, and preferably performing the vaporization.

The connecting section cooling section 4 substantially entirely cools the connecting section 3, and, in addition to this, the connecting section cooling section 4 is configured to include the plurality of connecting section cooling fins 41 that are supplied with the cooling gas CL and fitted to the connecting section 3, so that, even if the vaporizing section 2 is heated to and retained at approximately 300 degrees C., the gas-liquid mixing section 1 can be cooled to approximately 60 degrees C. by an action of the connecting section cooling section 4. Accordingly, even with such a simple structure, a high cooling effect can be obtained in the connecting section cooling section 4, and the problem of generation of the residue can be preferably prevented, while ensuring a function of the high temperature type vaporizing section 2.

Note that the present invention is not limited to the above-described embodiment.

Figure 5:
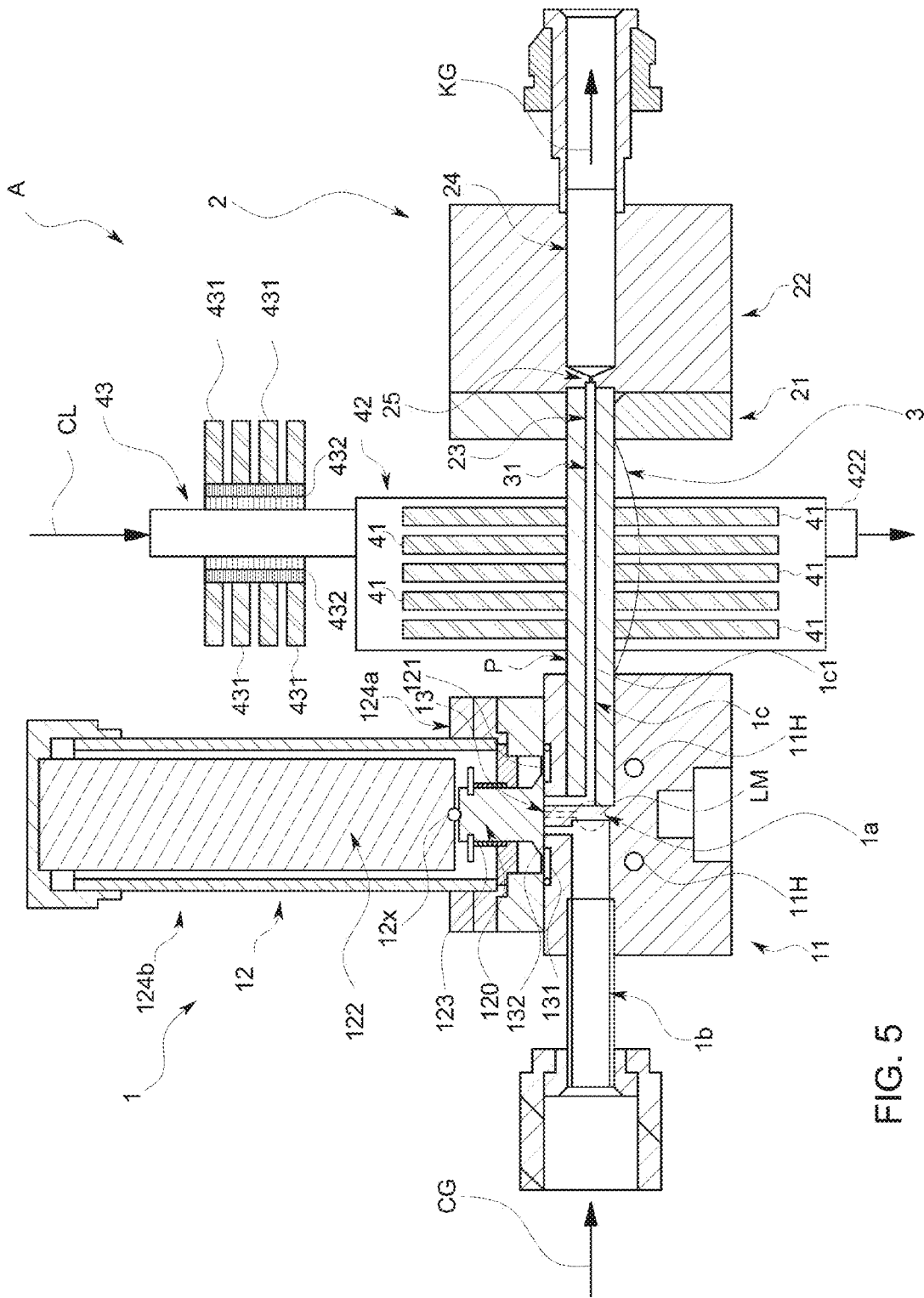
FIG. 5 is a structural cross-sectional view schematically illustrating a structural cross-section of a liquid material vaporizer according to another embodiment of the present invention.

For example, there may be employed an aspect including a cooling gas cooling section 43 for preliminarily cooling the cooling gas CL used for cooling the connecting section cooling fins 41. Specifically, as illustrated in FIG. 5, an aspect includes one adapted such that the cooling gas cooling section 43 includes: a plurality of cooling gas cooling fins 431; and a cooling gas cooling Peltier element 432 configured to be fitted toward a flow path for the cooling gas CL on a cooling side thereof and fitted to the cooling gas cooling fins 431 on a heat generating side thereof.

Employing such a configuration enables a higher cooling effect in the connecting section 3 to be obtained, and is further effective in preventing the above-described problem.

Figure 6:
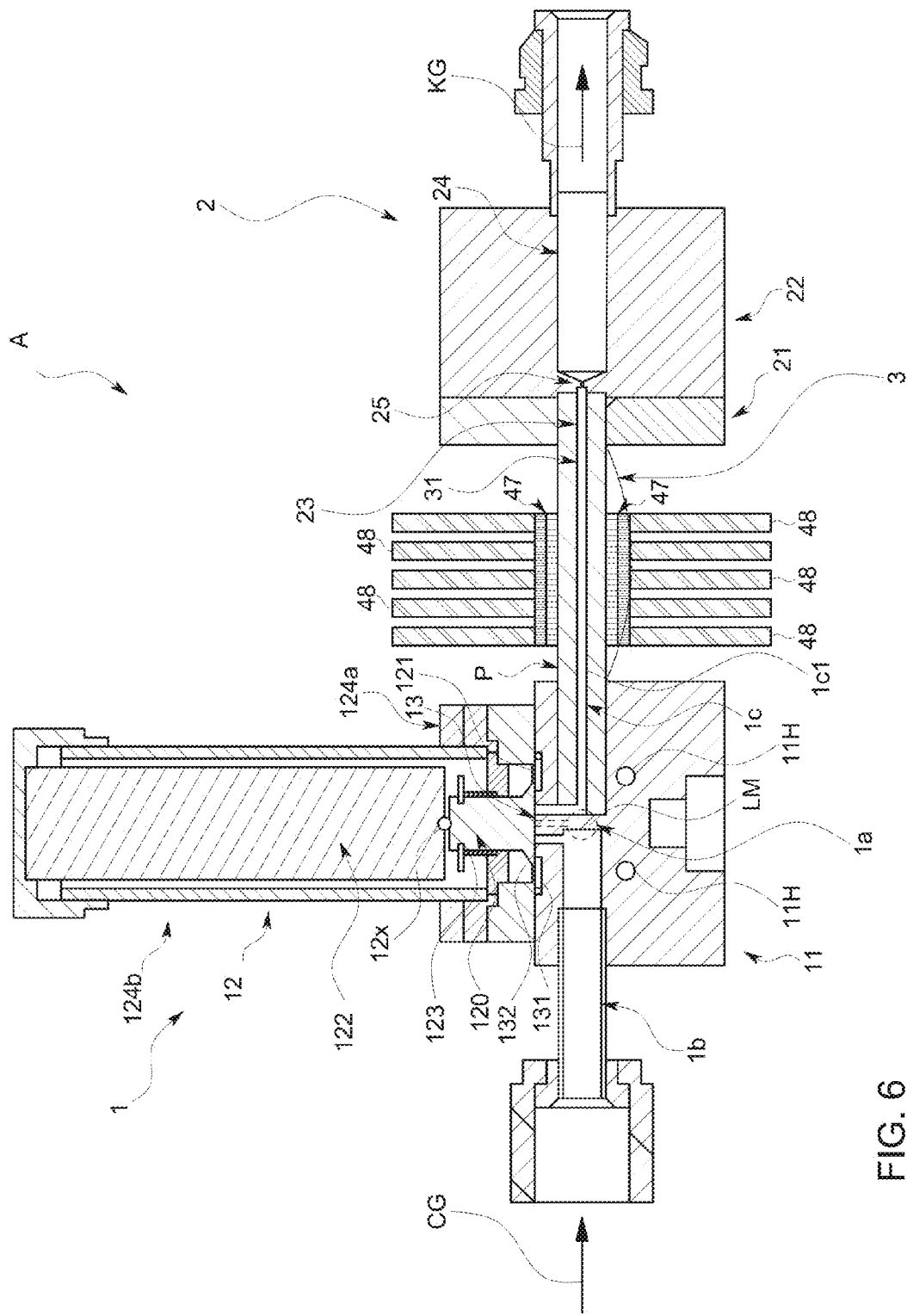
FIG. 6 is a structural cross-sectional view schematically illustrating a structural cross-section of a liquid material vaporizer according to further another embodiment of the present invention.

Also, as illustrated in FIG. 6, there may be employed an aspect in which the connecting section cooling section 4 is configured to include: a connecting section cooling Peltier element 47 fitted to the connecting section 3 on a cooling side thereof; and a plurality of Peltier element cooling fins 48 fitted to a heating side of the connecting section cooling Peltier element 47.

Employing such a configuration enables a problem of generation of the residue to be preferably prevented by directly, aggressively, and actively cooling the connecting section 3.

Figure 7:
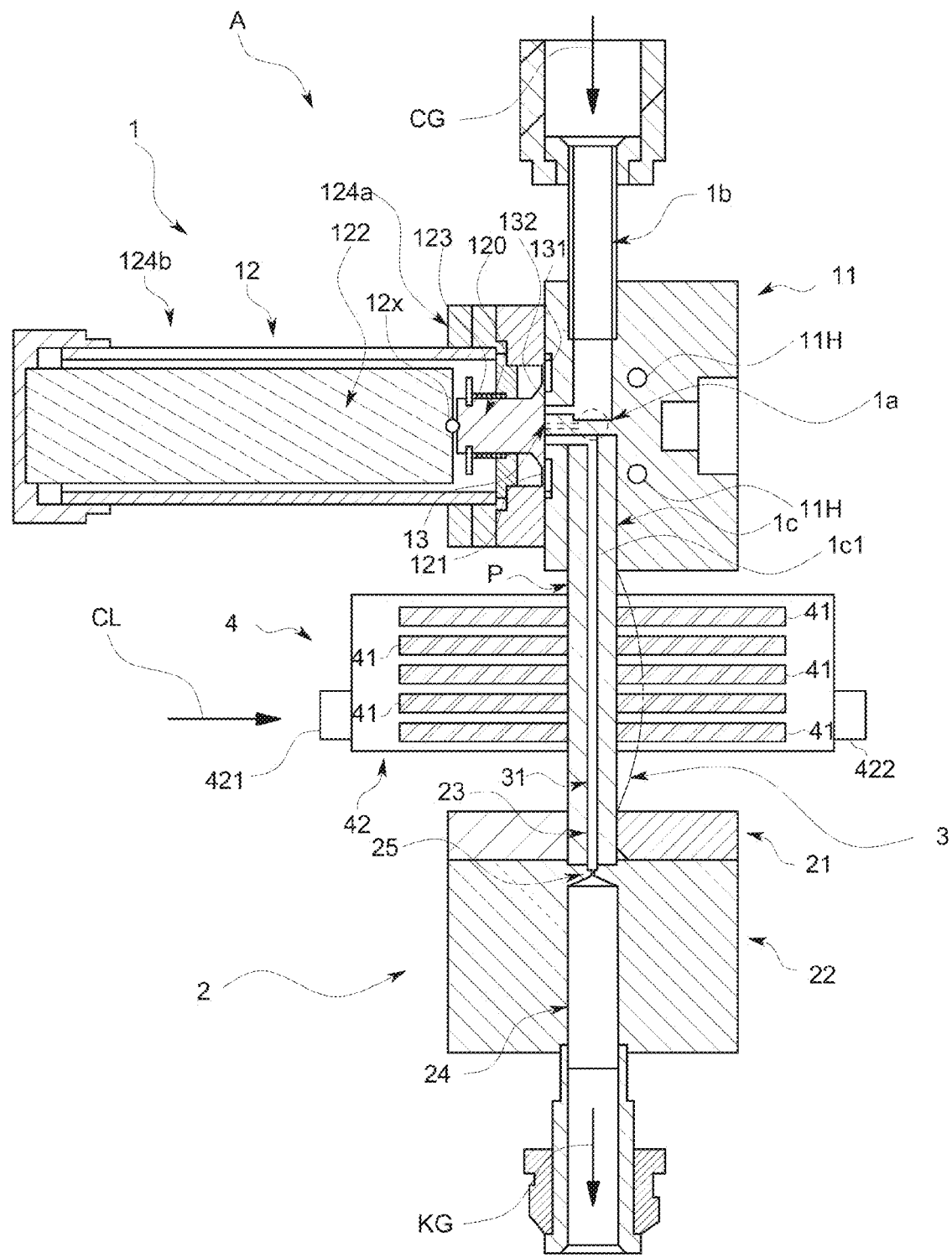
FIG. 7 is a structural cross-sectional view schematically illustrating a structural cross-section of a liquid material vaporizer according to still further another embodiment of the present invention.

Further, as illustrated in FIG. 7, there may be employed an embodiment in which the liquid material vaporizer A is configured to vertically arrange the gas-liquid mixing section 1, the connecting section 3 fitted with the connecting section cooling section 4, and the vaporizing section 2 in this order from the top.

Employing such a configuration enables a problem of blocking the nozzle section 25 to be prevented even if the liquid material LM remains in the nozzle section 25 of the vaporizing section 2, because the liquid material LM drops down due to gravitational force.

Further, a cooling method in the connecting section cooling section is not limited to that in the present embodiment, but an appropriate cooling method may be employed depending on an embodiment, such as water cooling using liquid for cooling.

Also, there may be employed a configuration in which a "backflow prevention nozzle" for preventing the liquid material supplied to the gas-liquid mixing chamber from flowing back into the carrier gas introduction path is further provided in addition to each of the above-described embodiments. A specific aspect of the backflow prevention nozzle includes, for example, a nozzle section for backflow prevention described in Japanese Unexamined Patent Publication No. 2003-273025 (pages 3 and 4, and FIG. 2).

Meanwhile, for example, if the gas introduction path 24 is hollow, lower pressure inside the path causes a gas density of the gas mixture KG to be reduced, resulting in a longer intermolecular distance. For this reason, heat becomes difficult to transfer, and therefore the gas mixture KG cannot be preferably exhausted outside. That is, the vaporization may be affected. For this reason, by arranging an unshown filling material in the gas introduction path 24, the heat transfer can be facilitated to preferably perform the vaporization even if the pressure inside the path is low. As the filling material, a metal material such as titanium having high thermal conductivity can be used. Also, regarding the filling material, a plurality of granular (spherical) filling materials may be arranged in the path, or one or a plurality of filling materials formed in a spiral shape by twisting flat plates (so-called static mixer) may be arranged in the path. The filling materials of the spiral shape result in lower pressure loss when arranged in the path, as compared with the granular filling materials, and therefore the vaporization can be more preferably performed.

Also, in a rear stage of the nozzle section 25, an unshown filter may be provided. Providing the filter enables the residue to be trapped even if the residue is generated. Also, even if unvaporized liquid of the gas-liquid mixture GL remains, from which mist is generated, the mist can be eliminated.

Figure 8:
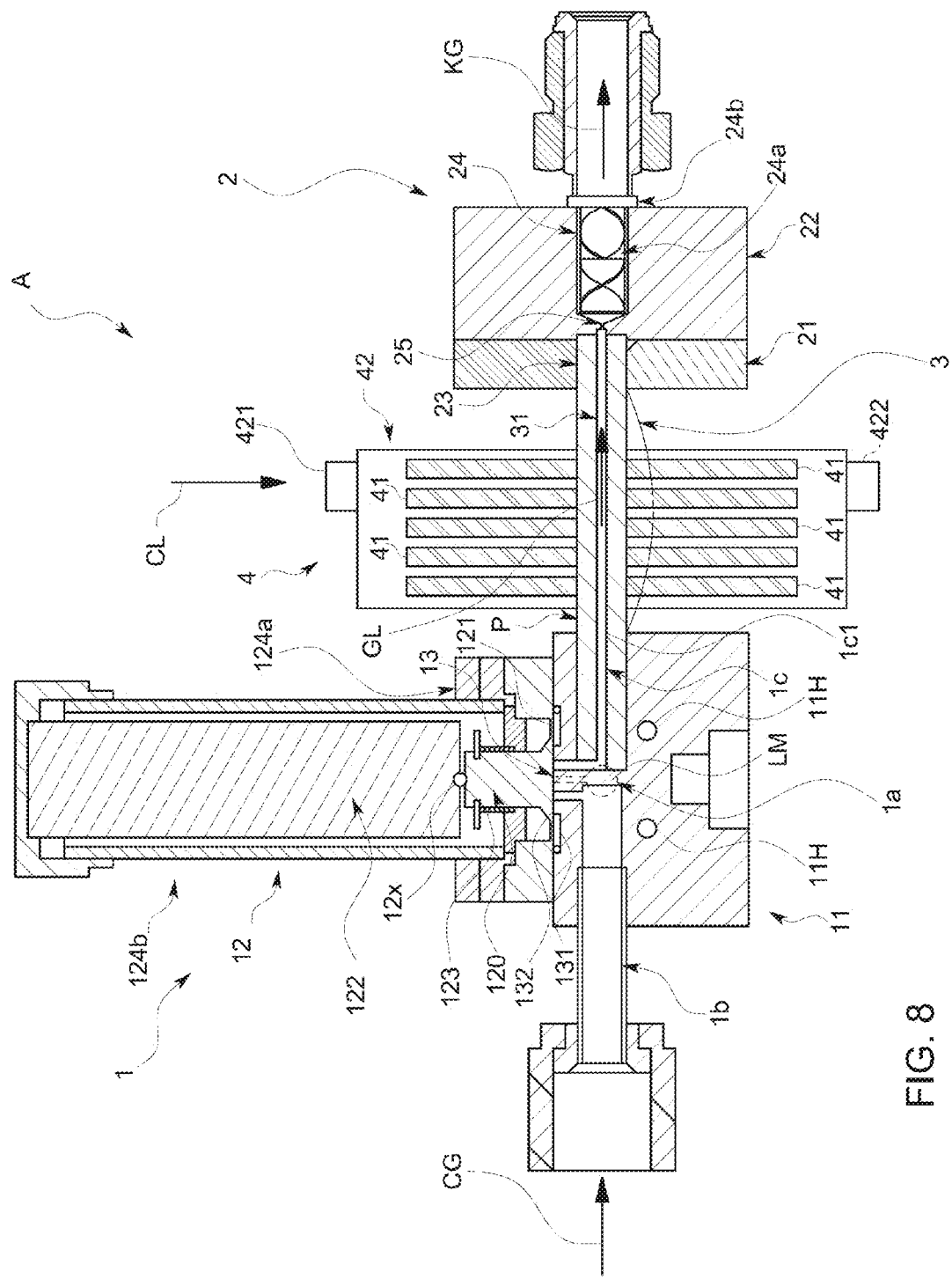
FIG. 8 is a structural cross-sectional view schematically illustrating a structural cross-section of a liquid material vaporizer according to yet another embodiment of the present invention.

FIG. 8 shows a liquid material vaporizer B having a static mixer 24a arranged in a gas exhaust path 24 of a vaporizing section of a liquid material vaporizer A and having a filter 24b arranged toward the downstream side of the static mixer 24a. Employing such a configuration enables the pressure loss to be lowered and the vaporization to be more preferably performed and also can prevent a residue from being exhausted from the liquid material vaporizer.

Note that the following experiments were performed in order to demonstrate the effects in the case of having a static mixer and a filter arranged in a liquid material vaporizer.

Figure 9:
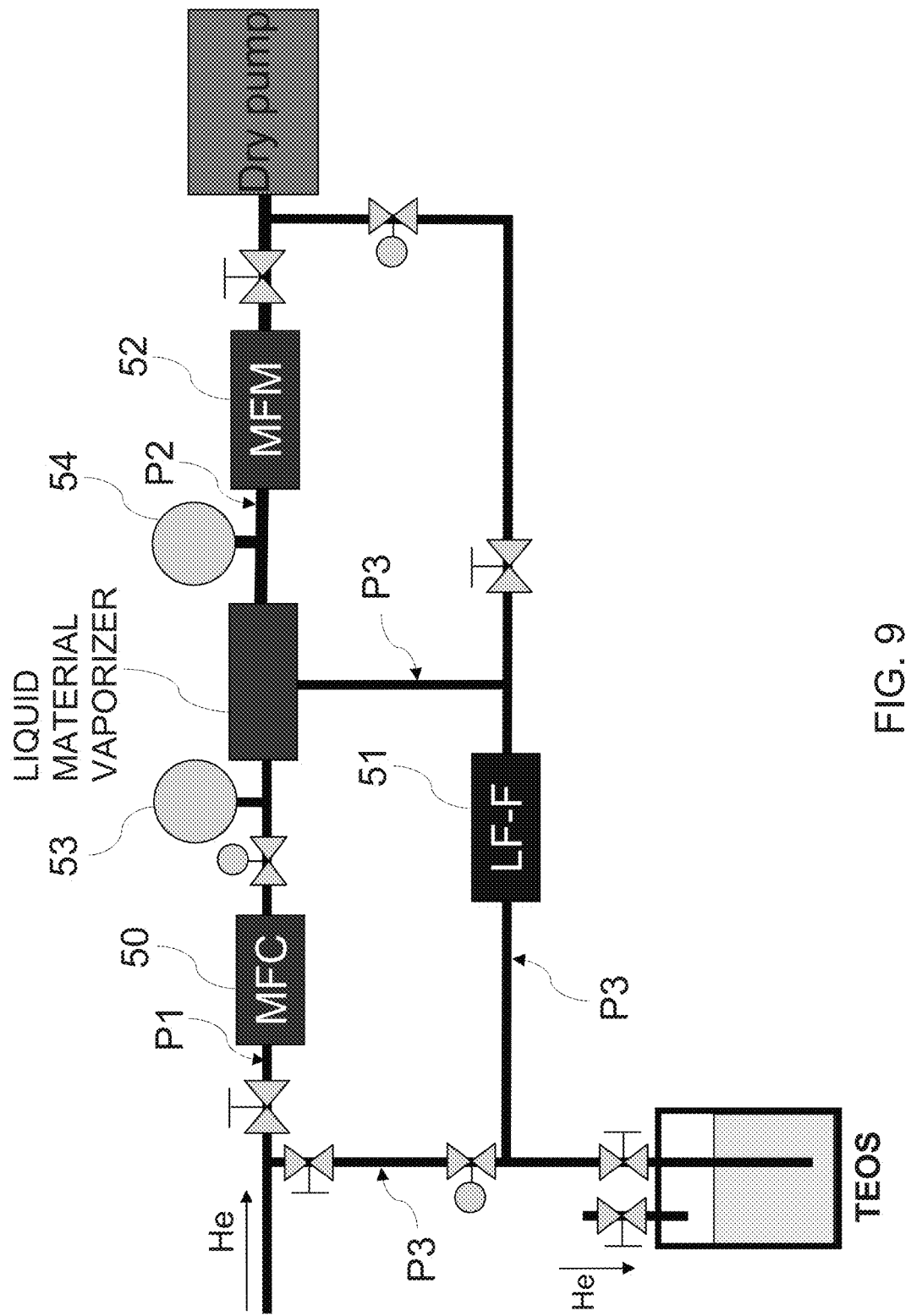
FIG. 9 is a flow path diagram showing an experiment using a liquid material vaporizer of the present invention.

The experiment method is described as follows. The liquid material vaporizer is arranged inside of the flow path. The flow path, as illustrated in FIG. 9, is branched to a pipeline P1 into which a carrier gas flows, and a pipeline P3 into which a liquid material flows. As for the pipeline P1, a mass flow controller 50 and a pressure gauge 53 are arranged toward the liquid material vaporizer side in this order, and that end is connected with a carrier gas introduction path 1b of the liquid material vaporizer. A gas exhaust path 24 of the liquid material vaporizer is also connected with one end of a pipeline P2, at which a pressure gauge 54 and a mass flow controller 52 are arranged in this order from the liquid material vaporizer B side, and another end is connected with a dry pump. Moreover, the pipeline P3 is branched to a pipeline connected with a liquid material introduction path 1a of the liquid material vaporizer, and to a pipeline connected with the dry pump, and a mass flow controller 51 is arranged at the pipeline connected with the liquid material vaporizer. In addition, the mass flow controllers 50 and 51 and a mass flow meter 52 are each mass flow meters, and any of a heat type and a Coriolis type may be used.

For purpose of comparison, the experiments are performed separately using the liquid material vaporizer A mentioned above, or the liquid material vaporizer B mentioned above, respectively, as the liquid material vaporizer.

In such a flow path, when a helium gas, which is a carrier gas, flows through the pipeline P1, the carrier gas, which flow rate is controlled by the mass flow controller 50, and which pressure is measured with the pressure gauge 53, will be introduced from a carrier gas introduction path 1b to the liquid material vaporizer. At this point, the pressure gauge 53 and the mass flow controller 50 measure the pressure and the flow rate by the upper stream side of the liquid material vaporizer respectively in accordance with a time series.

Moreover, when Tetraethoxysilane (TEOS), which is a liquid material, flows through the pipeline P3, the liquid material will be introduced from a liquid material introduction path 1a to the liquid material vaporizer after the flow rate is controlled by the mass flow controller 51. At this point, the mass flow controller 51 measures the flow rate of the liquid material in accordance with a time series.

The carrier gas and the liquid material introduced in the liquid material vaporizer are mixed in the liquid material vaporizer to become a gas-liquid mixture. After being vaporized by depressurizing the gas-liquid mixture, the vaporized gas and the carrier gas are mixed to become a gas mixture and the gas mixture is exhausted through a gas exhaust path.

The gas mixture exhausted from the liquid material vaporizer is drawn by a dry pump after its pressure measured by the pressure gauge 54 and its flow rate measured by the mass flow meter 52. At this point, the pressure gauge 54 and the mass flow meter 52 measure the pressure and the flow rate of the downstream side of the liquid material vaporizer respectively in accordance with a time series.

Note that in this experiment, a main temperature is set to be 100 degrees C., a steam temperature to be 110 degrees C., a flow rate of the carrier gas to be 1.5 SLM, and a supply pressure to be 0.2 MPa, and in the condition of non-operation of the liquid material vaporizer, a pressure of the downstream side is set to be 75 Torr and a temperature of the downstream side to be 150 degrees C.

Figure 10:
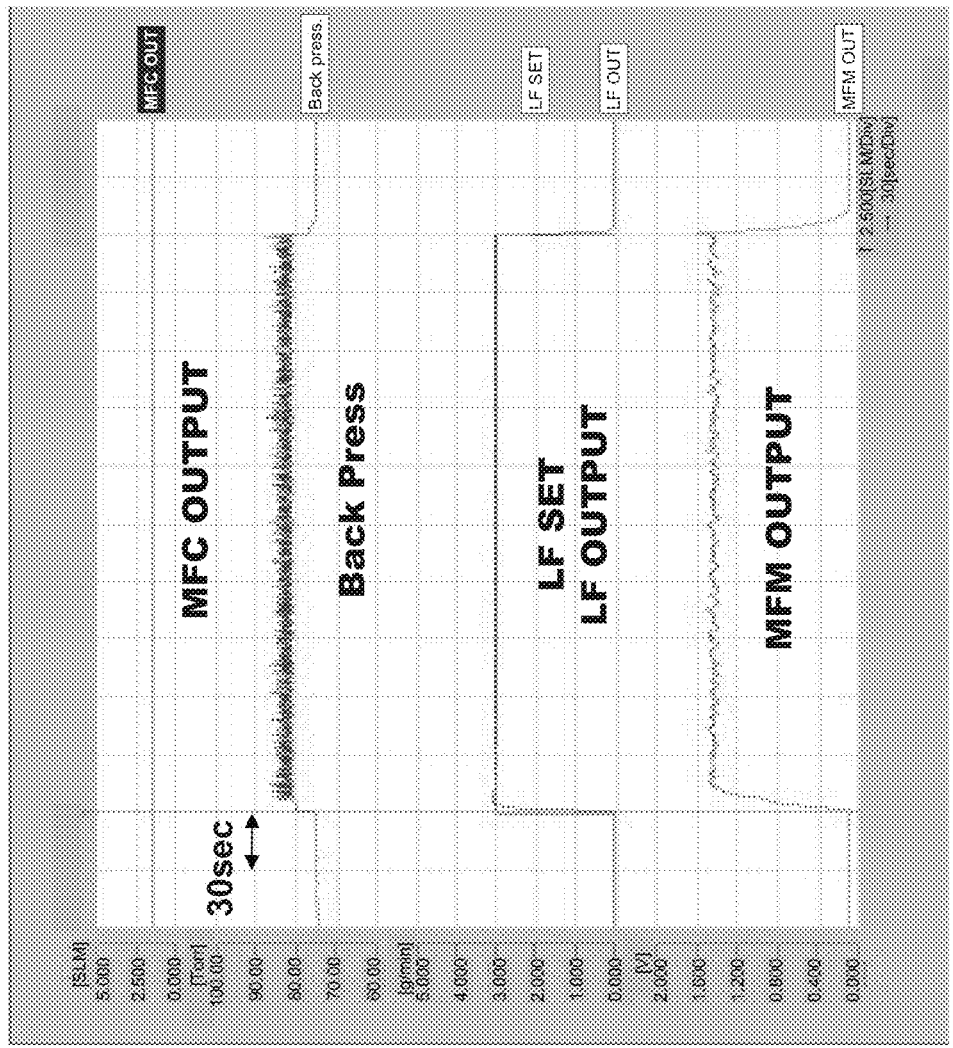
FIG. 10 is a graph depicting experimental results in the case of having arranged the liquid material vaporizer A of the present invention in the flow path.
Figure 11:
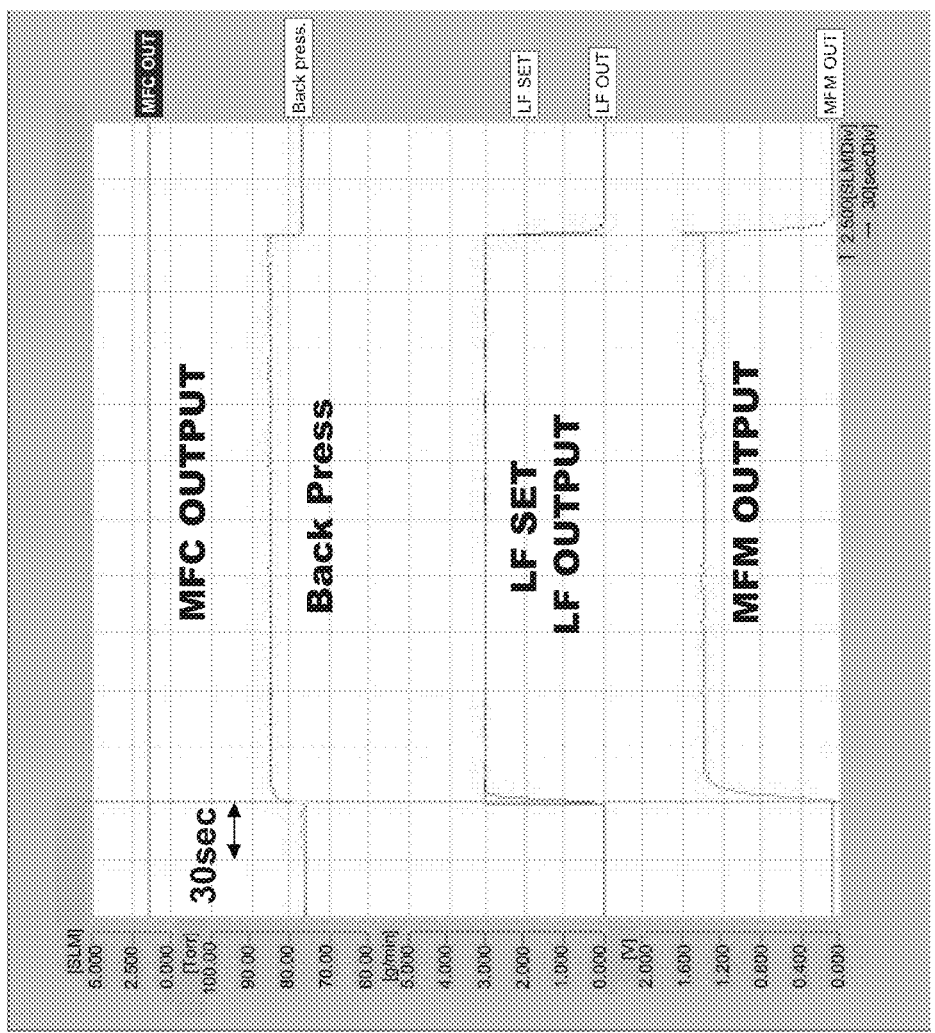
FIG. 11 is a graph depicting experimental results in the case of having arranged the liquid material vaporizer B of the present invention in the flow path.

The results of the experiment are discussed as follows. FIG. 10 is a graph depicting experimental results in the case of using the liquid material vaporizer A, and FIG. 11 is a graph depicting experimental results in the case of using the liquid material vaporizer B. Note that MFC OUTPUT indicates that the flow rate value of the carrier gas before being introduced to the liquid material vaporizer was measured by the mass flow controller 50 in accordance with a time series. Back Press indicates that the pressure value of the gas mixture exhausted from the liquid material vaporizer was measured by the pressure gauge 54 in accordance with a time series. LF SET/OUTPUT indicates that the flow rate value of the liquid material before being introduced to the liquid material vaporizer was measured by the mass flow controller 51 in accordance with a time series. MFM OUTPUT indicates that the electric power value of the gas mixture exhausted from the liquid material vaporizer was measured by the mass flow meter 52 in accordance with a time series.

As shown in FIGS. 10 and 11, the values of MFC OUTPUT and LF SET/OUTPUT show hardly any changes in the graph and are stable when using either the liquid material vaporizer A or the liquid material vaporizer B.

On the other hand, when using the liquid material vaporizer A, as shown in FIG. 10, the values of Back Press and MFM OUTPUT change finely in the graph according to a time series, but when using the liquid material vaporizer B, as shown in FIG. 11, they hardly change in the graph and are stable.

This is considered to be because when using the liquid material vaporizer A, the values of Back Press and MFM OUTPUT are changed finely by exhausting the liquid material, which was not vaporized in the gas exhaust path 24, to the pipeline P2 in the mist state by being pressed by the carrier gas or being depressurized and drawn toward the downstream side.

On the other hand, it is believed that when using the liquid material vaporizer B, the liquid material has lower pressure loss and is in the state of being easy to vaporize by arranging a static mixer 24a in the gas exhaust path 24 and also the mist is not included in the gas mixture being exhausted in the pipeline P2 by collecting the unvaporized liquid material by a filter 24, and therefore the values of Back Press and MFM OUTPUT are stable compared with those of using the liquid material vaporizer A.

Accordingly, by arranging the static mixer 24a and filter 24b in the gas exhaust path 24 of the liquid material vaporizer B, the liquid material can be more preferably vaporized and the exhaustion of a residue by being mixed in the gas mixture can be prevented.

Figure 12:
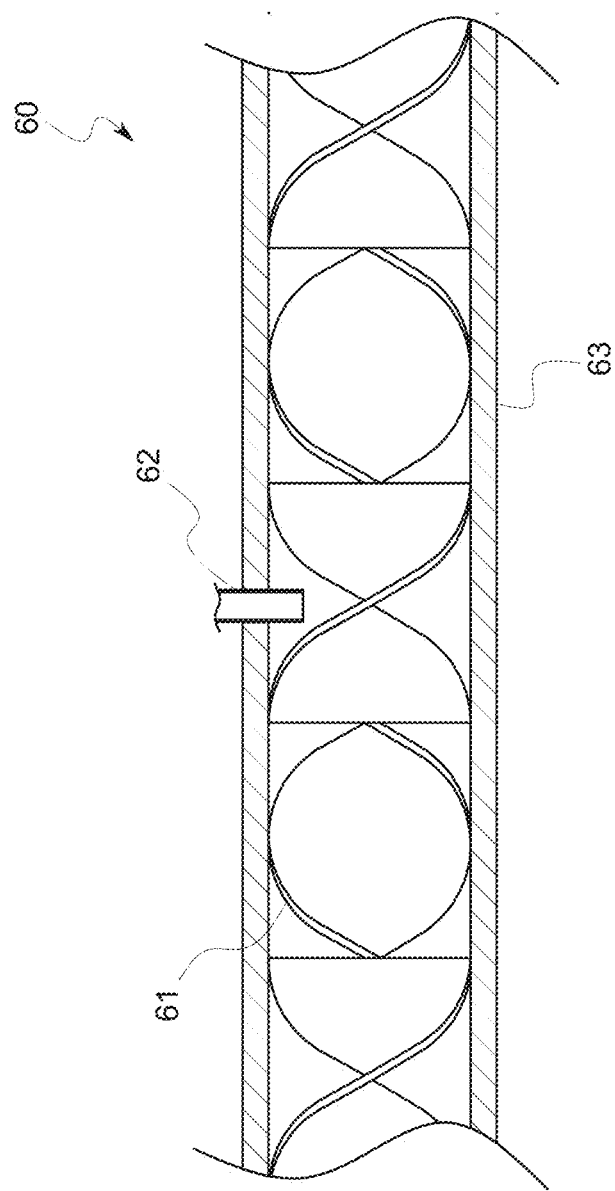
FIG. 12 is a structural cross-sectional view schematically illustrating a structural cross-section of a gas-liquid mixing section according to another embodiment of the present invention.

As another embodiment of the present invention, as shown in FIG. 12, a static mixer 61 may be arranged in a gas-liquid mixing section 60. Accordingly, the uniformity or the heat exchange effectiveness of the temperature and concentration of the liquid material and the carrier gas can be improved.

Figure 13:
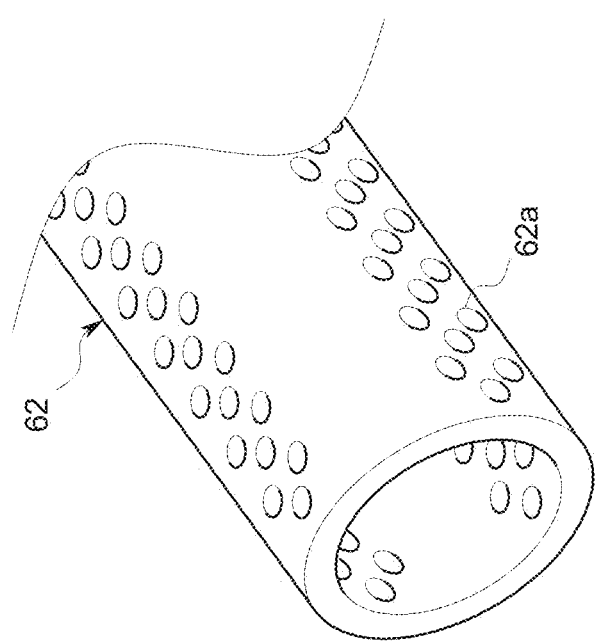
FIG. 13 is a cross-sectional view schematically illustrating a nozzle section according to another embodiment of the present invention.

With this, as shown in FIGS. 12 and 13, the tip of a nozzle 62 where the liquid material is exhausted may be arranged to reach the center of the hollow section of a piping 63 and a nozzle 62 may be configured to have multiple holes 62a. Therefore, the liquid material can be more preferably diffused.

Furthermore, the specific configuration of each of the sections is not limited to those configuration of the above-described embodiments, but may be variously changed without departing from the scope of the present invention.

INDUSTRIAL APPLICABILITY

The liquid material vaporizer having such configuration according to the present invention can prevent a residue from being generated to preferably perform the vaporization even if a liquid material including a plurality of materials having different boiling points is vaporized, and is therefore preferably used as, for example, a liquid material vaporizer for vaporizing various liquid materials used in semiconductor manufacturing.

We claim:

1. A liquid material vaporizer comprising:
   a gas-liquid mixing section for mixing a liquid material and a carrier gas to generate a gas-liquid mixture;
   a heating type vaporizing section for vaporizing the gas-liquid mixture from the gas-liquid mixing section and exhausting outside a gas generated by the vaporization with assistance of the carrier gas;
   wherein the vaporizing section includes one or a plurality of flat plates formed in a spiral shape by an inwardly twisting path.

2. The liquid material vaporizer according to claim 1, wherein a filter is arranged on a rearward part of the vaporizing section.

3. The liquid material vaporizer according to claim 1, wherein the vaporizing section has a gas introduction path, gas exhaust path, and a nozzle section provided at a connecting section between the gas introduction path and the gas exhaust path.

4. The liquid material vaporizer according to claim 3, wherein a filter is arranged behind the nozzle section.

* * * * *